(12) United States Patent
Wu et al.

(10) Patent No.: US 11,749,791 B2
(45) Date of Patent: Sep. 5, 2023

(54) LED PRECISION ASSEMBLY METHOD

(71) Applicant: Jabil Inc., St. Petersburg, FL (US)

(72) Inventors: Weiping Wu, Penang (MY); Charly Beaujeu, Penang (MY)

(73) Assignee: Jabil Inc., St. Petersburg, FL (US)

( * ) Notice: Subject to any disclaimer, the term of this patent is extended or adjusted under 35 U.S.C. 154(b) by 525 days.

(21) Appl. No.: 16/644,748

(22) PCT Filed: Sep. 8, 2017

(86) PCT No.: PCT/MY2017/050053
§ 371 (c)(1),
(2) Date: Mar. 5, 2020

(87) PCT Pub. No.: WO2019/050388
PCT Pub. Date: Mar. 14, 2019

(65) Prior Publication Data
US 2020/0266325 A1    Aug. 20, 2020

(51) Int. Cl.
*H01L 33/62* (2010.01)
*H01L 25/075* (2006.01)
*H05K 1/18* (2006.01)
*H05K 3/00* (2006.01)
(Continued)

(52) U.S. Cl.
CPC .......... *H01L 33/62* (2013.01); *H01L 25/0753* (2013.01); *H05K 1/181* (2013.01); *H05K 3/0008* (2013.01); *H05K 3/0047* (2013.01); *H05K 3/321* (2013.01); *H05K 3/3431* (2013.01); *H05K 3/3494* (2013.01); *H01L 2933/0066* (2013.01); *H05K 2201/10106* (2013.01); *H05K 2203/166* (2013.01)

(58) Field of Classification Search
CPC ...................................................... H01L 33/62
See application file for complete search history.

(56) References Cited

U.S. PATENT DOCUMENTS

| 2009/0021181 | A1  | 1/2009 | Brune et al. |
| 2010/0134711 | A1* | 6/2010 | Park ................. G02F 1/133603 313/498 |
| 2011/0003411 | A1  | 1/2011 | Choi |

(Continued)

FOREIGN PATENT DOCUMENTS

| DE | 102014210654 A1 | 12/2015 |
| DE | 102015200393 A1 | 7/2016 |

(Continued)

*Primary Examiner* — Rafferty D Kelly
(74) *Attorney, Agent, or Firm* — Young Basile Hanlon & MacFarlane, P.C.

(57) ABSTRACT

System and methods to enable integration of electronic components to form LED assembly with a high accuracy (0.1 mm or better) and high process capability (Cpk of 1.67 or higher) for realizing precision electro-mechanical device. The system and methods use through holes that connect a printed circuit board to a housing as fiducial marks and LED emitter center as a reference point for alignment in order to improve the efficacy and accuracy of assembling of the LED assembly. The through holes are drilled by using laser drilling or milling machine, Use of adhesive to anchor the LED component down prior to reflow process i.e. to avoid self alignment characteristic of component on solder paste during reflow process.

20 Claims, 10 Drawing Sheets

(51) Int. Cl.
   *H05K 3/32*    (2006.01)
   *H05K 3/34*    (2006.01)

(56) References Cited

U.S. PATENT DOCUMENTS

| | | |
|---|---|---|
| 2015/0377426 A1 | 12/2015 | Ogata et al. |
| 2016/0197044 A1* | 7/2016 | Haefner .................. H01L 22/12 |
| | | 356/138 |
| 2017/0038056 A1 | 2/2017 | Joiris |
| 2017/0211769 A1 | 7/2017 | Fu et al. |

FOREIGN PATENT DOCUMENTS

| | | |
|---|---|---|
| EP | 2983458 A1 | 2/2016 |
| WO | 2010071279 A1 | 6/2010 |

* cited by examiner

LED PRECISION ASSEMBLY METHOD

FIELD OF INVENTION

The field of invention is printed circuit board fabrication systems, method and more specifically to systems for manufacturing a Light Emitting Diode (LED) assembly.

BACKGROUND

A fiducial mark or fiducial is an object placed in the field of view of an imaging system for use as a point of reference or a measure. It may be either something placed into or on the imaging subject, or a mark or set of marks in the reticle of an optical instrument. Fiducials are often used for the alignment of surface mount technology (SMT) components onto a printed circuit board assembly. Assembly machines use cameras to locate fiducial marks, vision SMT components body and then adjust component placement based on the exact position of the board. Generally, diagonal fiducial mark use for placement alignment, however, which and how many fiducial mark use for alignment, it is also depend on end product application requirement.

The fiducial marks are generally formed in the top layer of copper on a printed circuit board. The fiducials often consist of a circular area of the circuit board that that is left bare from solder-mask coating. As a result, the exposed copper plating area forms a high contrast reference point for the vision system to identify.

Reflow soldering is a technique that is often used in the assembly of surface mounted printed circuit board. Reflow soldering uses solder paste that includes powder particles and flux. The solder paste is used to temporarily attach electrical components to their contact pads. After all of the electrical components have been temporarily attached, the resulting assembly is heated to melt the solder and permanently connect the electrical components to the printed circuit board. Use adhesive is another interconnect techniques to bond SMT components onto printed circuit board, select solder paste or adhesive material for interconnection is depend on end product application and its requirement.

Reflow soldering is often used in conjunction with adhesives in certain assembly application. Before soldering, components are bonded to the PCB with adhesive. This allows, for example, SMT components to be positioned on a circuit board and cured within just a few seconds to prevent their falling over or sliding out of position on the PCB. The secured components can then be reflow-soldered in a single work step which saves time and speeds up production. In some application, the adhesive can be cured using the same temperature reflow profile as solder paste, the non conductive adhesive here is used for securing the SMT components to prevent self-alignment during reflow process stage.

Also common to the fabrication of surface mounted printed circuit board, are component placement systems ("pick and place machines"). The "pick and place machine" receives an unpopulated circuit board, retrieves electrical parts and then places the electrical parts in the proper position on the board. To determine the proper positioning of the electrical parts, computer vision systems are used. The computer vision system determines the center of the electrical component body which is then used in the retrieval and placement of the component.

Light Emitting Diode (LED) emitter modules are a type of surface mount component that emits light when activated. The module includes a p-n junction diode that connects a cathode and an anode.

SUMMARY

The disclosed methods enable integration of electronic components to form LED assembly with a high accuracy (0.1 mm or better) with high process capability (Cpk of 1.67 or higher). By using defined through holes that connect a printed circuit board to a housing as fiducial marks and LED emitter center as a reference point for alignment, the efficacy and accuracy of the assembly of the LED assembly is improved. Advantages are able overcome variances in tolerance stacked up on existing product design, materials (LED and PCB), process and machine capabilities challenges and avoid the cost increasing in PCB and LED houses due to tighter fabrication tolerance requirement, this raw material fabrication tolerance is more referring to standard fabrication tolerance available in the industry.

BRIEF DESCRIPTION OF THE DRAWING(S)

DETAILED DESCRIPTION OF THE PREFERRED EMBODIMENT(S)

Figure 1:
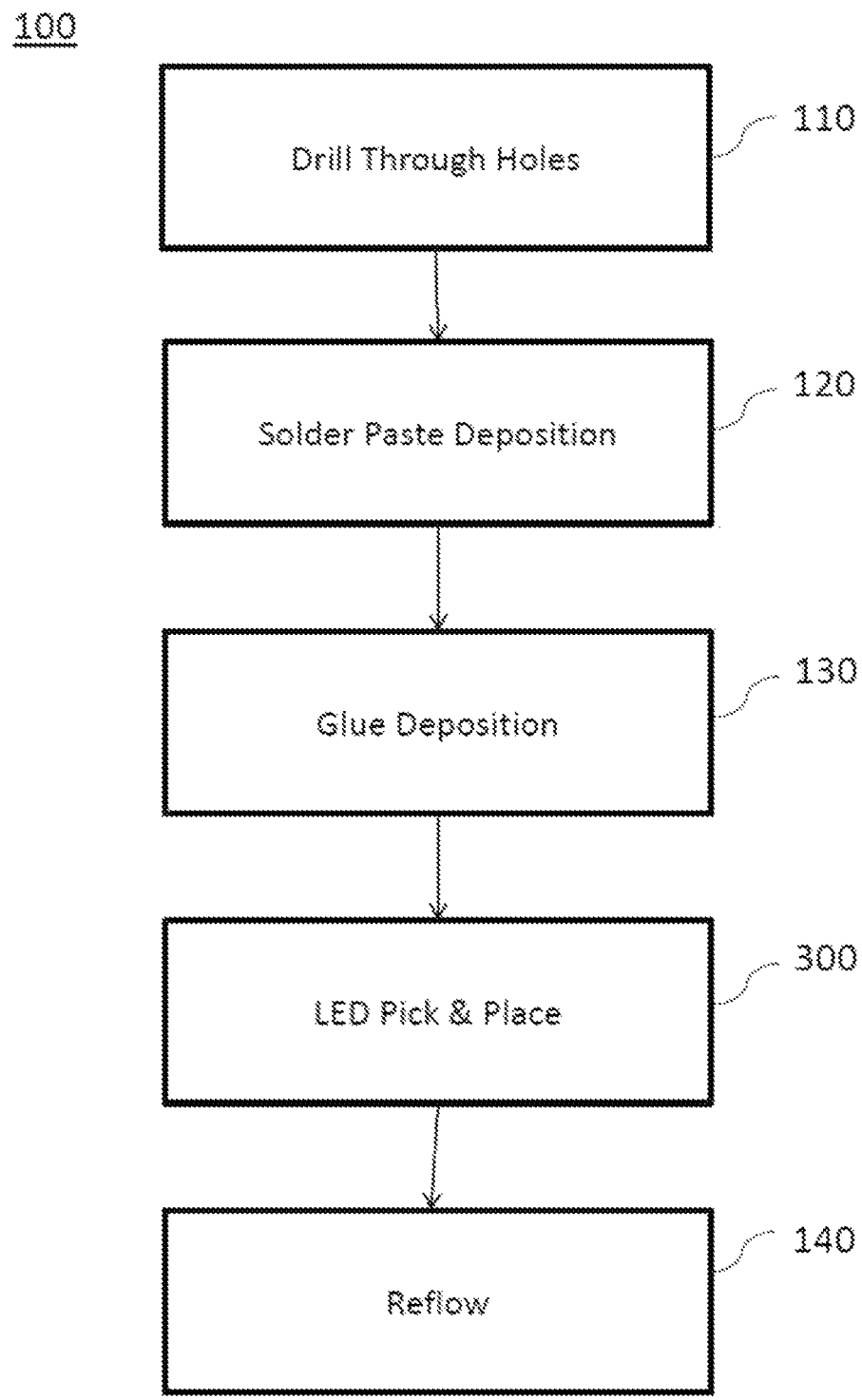
FIG. 1 is a flow diagram for a process to manufacture an LED assembly according to an embodiment.

FIG. 1 is a graphic depiction of a process 100 to manufacture a Light Emitting Diode (LED) assembly in accordance with an embodiment of the invention. In step 110, through holes 210 are drilled in a printed circuit board 200. Example positioning of the through holes is graphically depicted in FIG. 2A and FIG. 2B. The drilled through holes may be used to attach the printed circuit board to a housing (not pictured) to become a final finished goods. The through holes may also be used as fiducial marks. The holes may be drilled using a laser drilling or milling machine or any other means known in the art. In some embodiments, the tolerance of the positioning of the through holes may be +/−0.05 mm or better or worse. One or more of the through holes 210 may be a different shape example oblong, circular etc.

Then, in step 120, solder paste is applied to the printed circuit board 200. The solder paste may be applied to a region of the printed circuit board 200 where LED modules 220 may be mounted. The solder paste may be of any form known in the art. The solder paste may be applied by any process known in the art suh as stencil printing, dispensing, jetting and pin transfer etc. process. In some embodiments, the height of the solder paste needs to be controlled at certain height and in order to comply with final product requirements. In other embodiments, other interconnect techniques may be used to bond SMT components onto printed circuit board. The solder paste or electrically conductive adhesive material used for interconnection may be selected based on end product application and its requirement.

Next, in step 130, non conductive adhesive glue is applied to printed circuit board 200. The non conductive adhesive glue attaches the LED modules 220 to the printed circuit board 200. The non conductive adhesive glue may be of any form known in the art that is compatible with a solder reflow process. The adhesive glue may be applied using any process known in the art such as stencil printing, dispensing, jetting and pin transfer etc process. The purpose of the non conductive adhesive glue is to fix the SMT components to avoid self-alignment during reflow process stage.

Then, in step 300, the LED modules 220 are retrieved and placed on the printed circuit board 200. The process of retrieving and placing the LED module 220 is graphically depicted in FIG. 3. This process may be executed by a "Pick and Place Machine." Once the LED modules 220 are placed on the printed circuit board 200, the solder paste or electrically conductive adhesive applied in step 120 is reflowed. The solder paste or electrically conductive adhesive may be reflowed by any technique known in the art. As a result of the reflow process, the solder in the solder paste melts or electrically conductive adhesive and permanently connects the LED module 220.

Figure 2A:
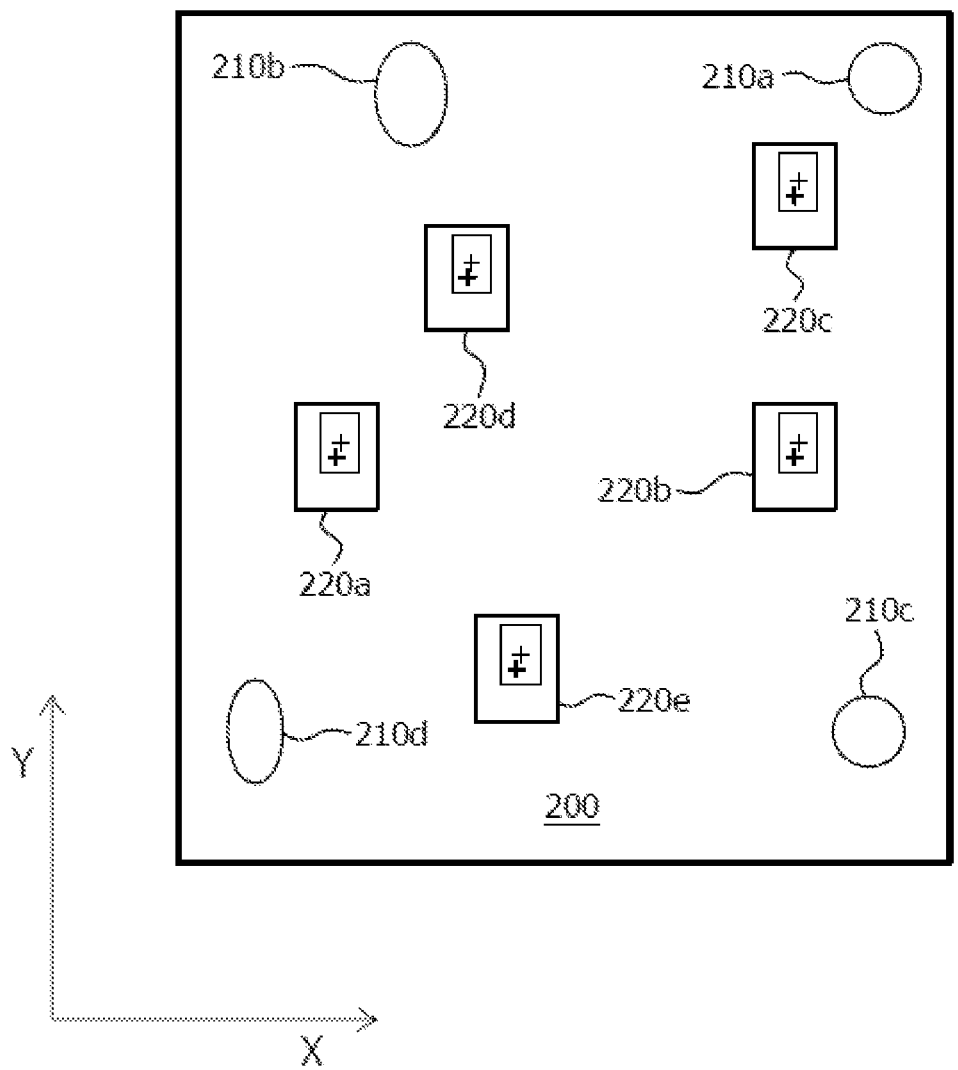
FIG. 2A is a graphic depiction of a printed circuit board according to an embodiment.

FIG. 2A depicts an arrangement of through holes 210 and LED modules 220 on a printed circuit board 200. Although FIG. 2A depicts five LED modules (220A, 220B, 220C, 220D and 220E), other numbers of LED modules 220 may be used. Similarly, FIG. 2A depicts four through holes 210A, 210B, 210C and 210D. However, other numbers of through holes 210 may be utilized.

Figure 2B:
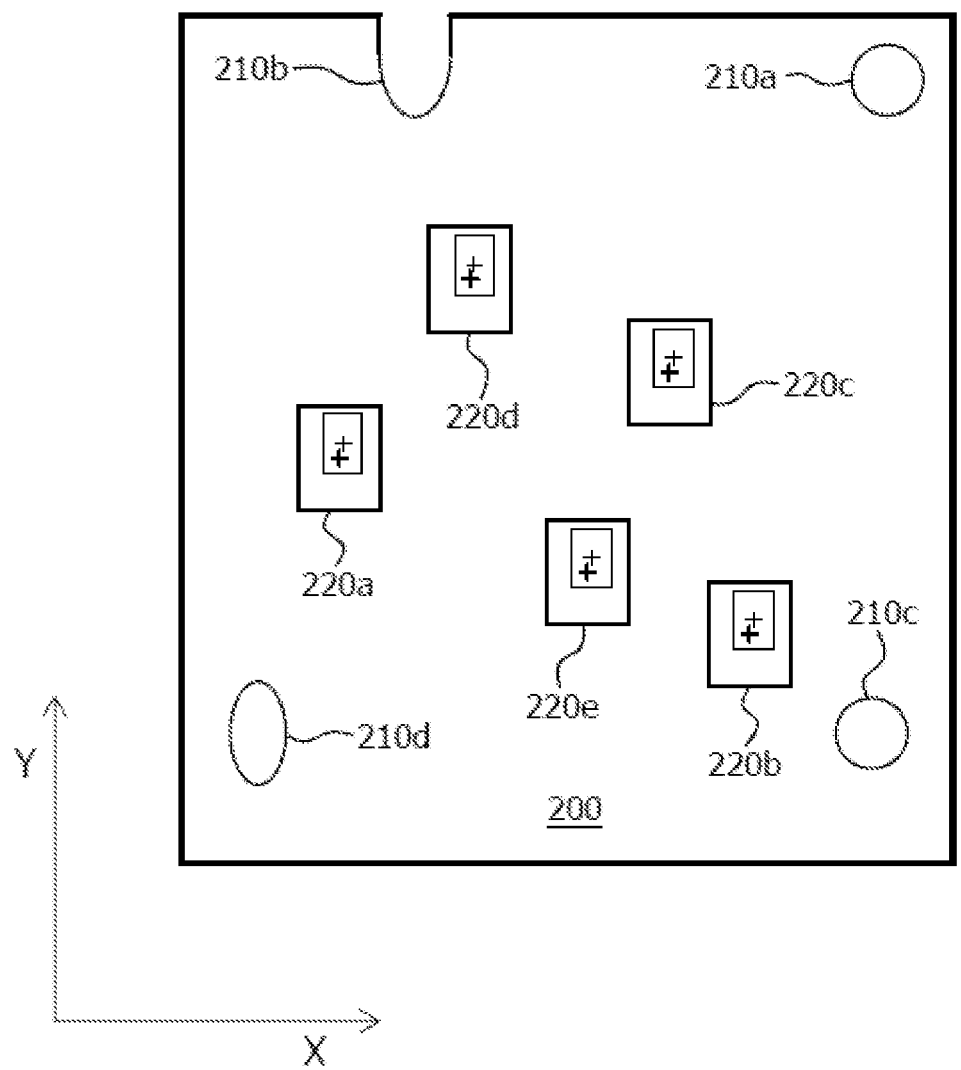
FIG. 2B is a graphic depiction of a printed circuit board according to an embodiment.

FIG. 2B depicts an alternate arrangement of through holes 210 and LED modules 220 on a printed circuit board 200. In this arrangement, through hole 210B is formed through an edge of the printed circuit board 200.

Figure 2C:
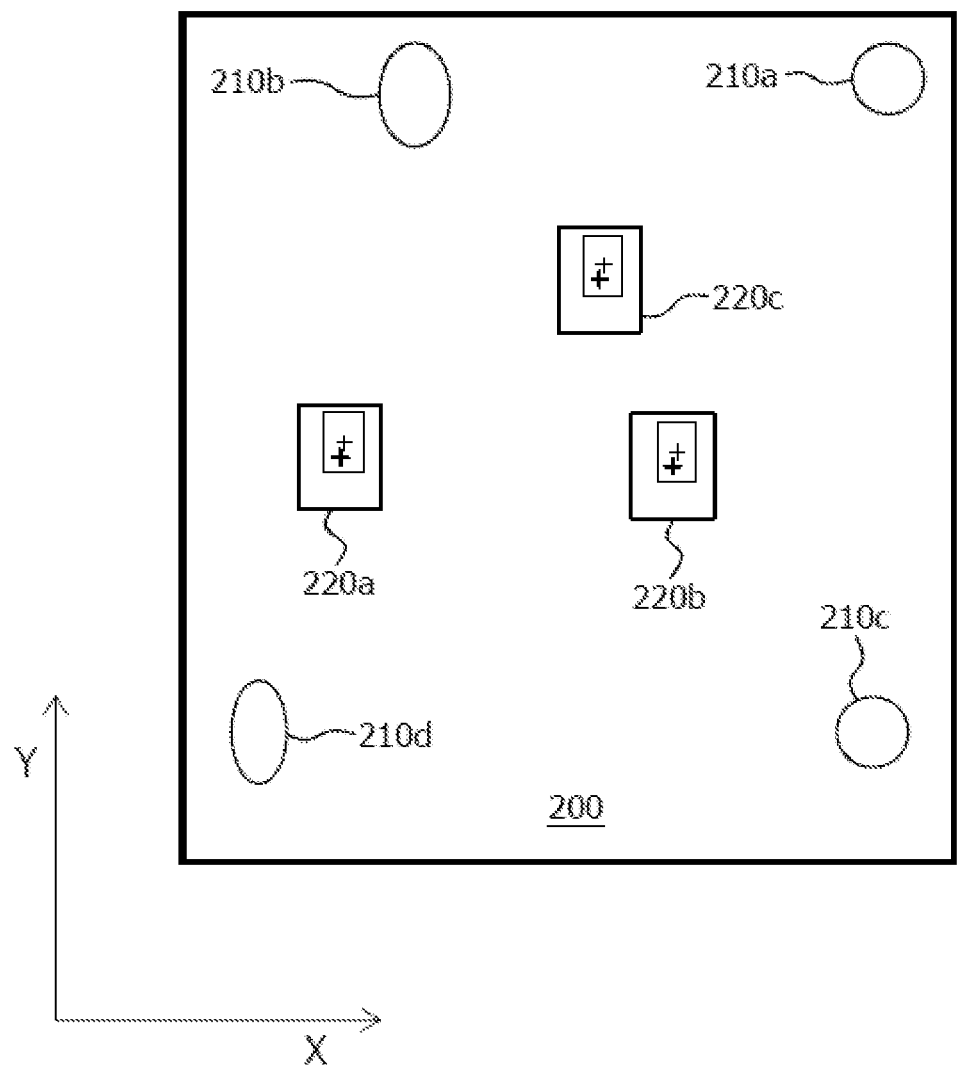
FIG. 2C is a graphic depiction of another embodiment of a printed circuit board.

A possible arrangement of the LED modules 220 with respect to through holes 210*a* is depicted in FIG. 2C. FIG. 2C depicts an embodiment with 3 LED modules 220*a*, 220*b* and 220*c*. However, a person of ordinary skill would appreciate that any number of LED modules 220 can be used.

Figure 2D:
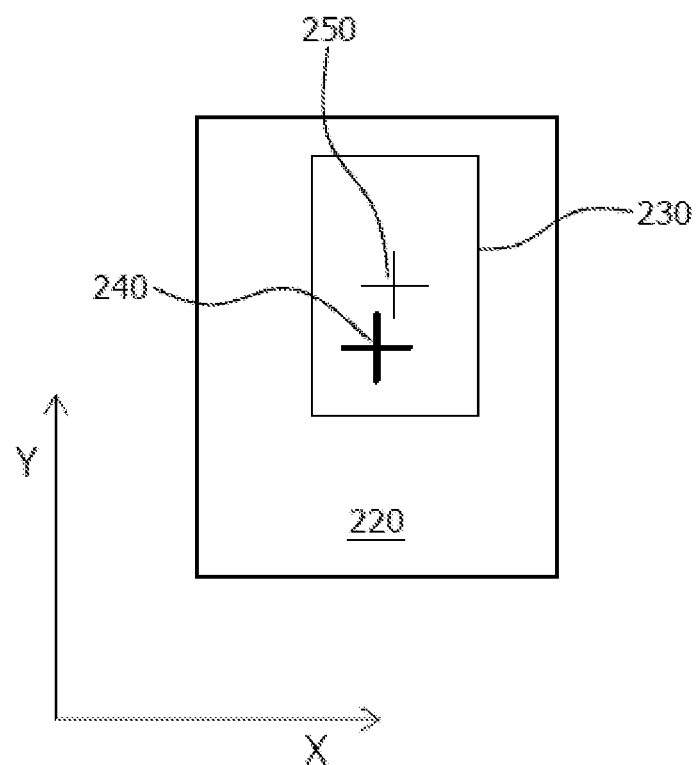
FIG. 2D is a graphic depiction of an LED module according to an embodiment.

FIG. 2D shows the arrangement of components within the LED modules 220. The LED module 220 includes a LED emitter 230. The LED 220 has a center 240. The light emitter 230 has a center 250. In many embodiments, the center 240 of the LED module is different than the center 250 of the light emitter.

Figure 3:
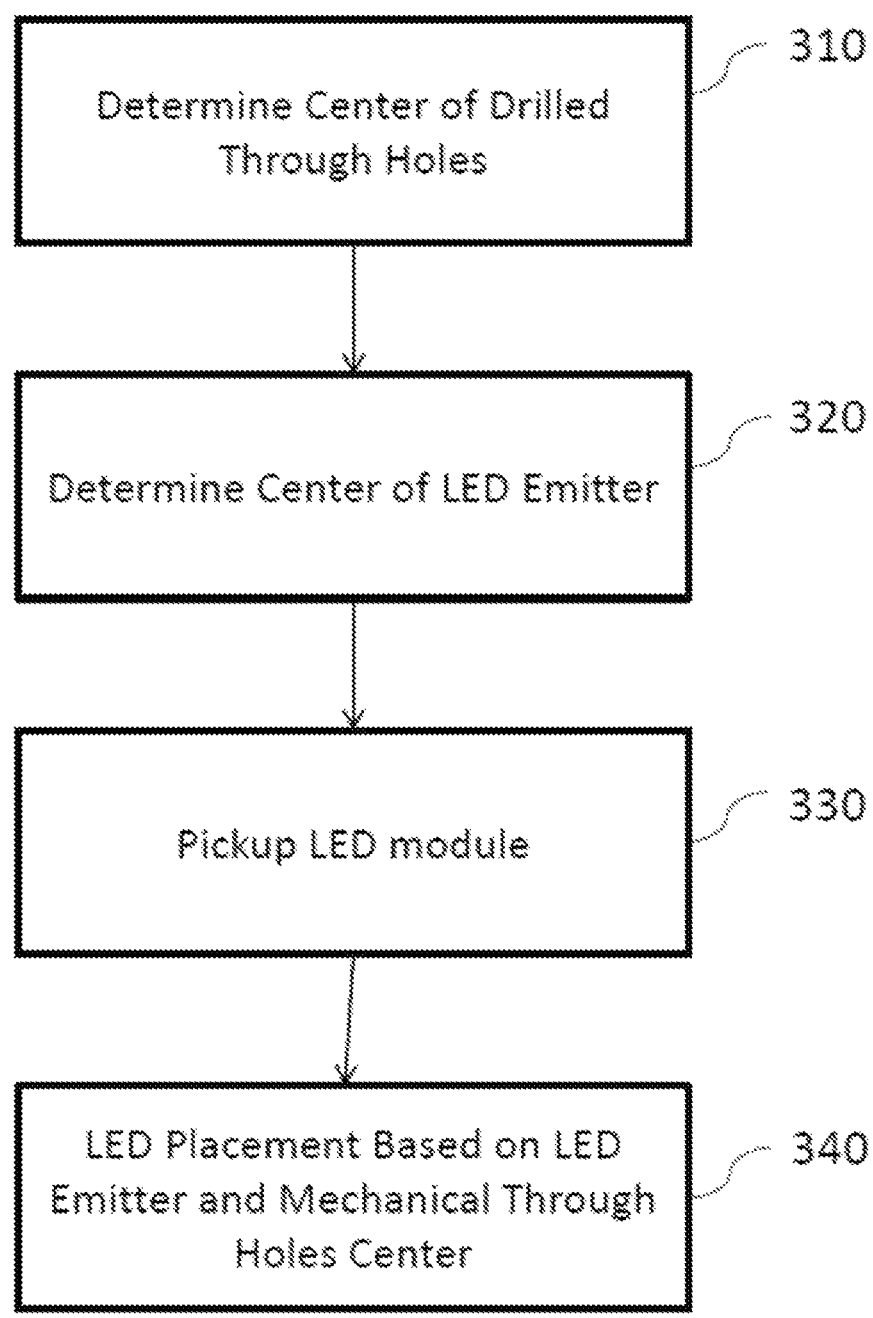
FIG. 3 is a flow diagram of the LED Pick and Place process according to an embodiment.

FIG. 3 shows a process for placing the LED Pick and Place process performed in step 300. In step 310, the center of the through holes 210 drilled in step 110 are determined. The centers of the through holes may be determined using a computer visioning system. The computer visioning system may capture a plurality of images of each through hole 210. Then, based on the plurality of acquired images, the center 410 of each through hole may be determined. The computer vision system of the assembly machine will determine number of points on the edge of the through hole to be recognized, based on those X, Y coordinates to calculate the center of the through hole. This process is discussed in more detail with regard to FIG. 4 (discussed below). Generally, the more points used for the calculation the better the accuracy however the cycle time is increased.

Next, in step 320, the center 250 of the LED emitter 230 of the LED module 220 is determined. The center 250 of the LED emitter is determined by acquiring a plurality of images of the LED module 220. Then, using the plurality of the images, the center 250 is determined. The computer vision system of the assembly machine determines a number of points on the edge of the LED emitter to be recognized, based on those X, Y coordinates to calculate the center of the LED emitter. Generally, the more points used for the calculation the better the accuracy however the cycle time is increased The LED module is then picked up in step 330. The LED module may be picked up from a tape feeder or moving carriage. In many embodiments, the emitter center 250 of the LED module is used to pick up the LED module.

Finally, in Step 340 the LED modules 220 are placed on the printed circuit board 200 based on the determined centers 410 of the through holes and the center 250 of the LED emitter. To orient the placement of the LED modules 220 on the printed circuit board 200, the center 410 of the through holes are used as fiducial marks.

Figure 4:
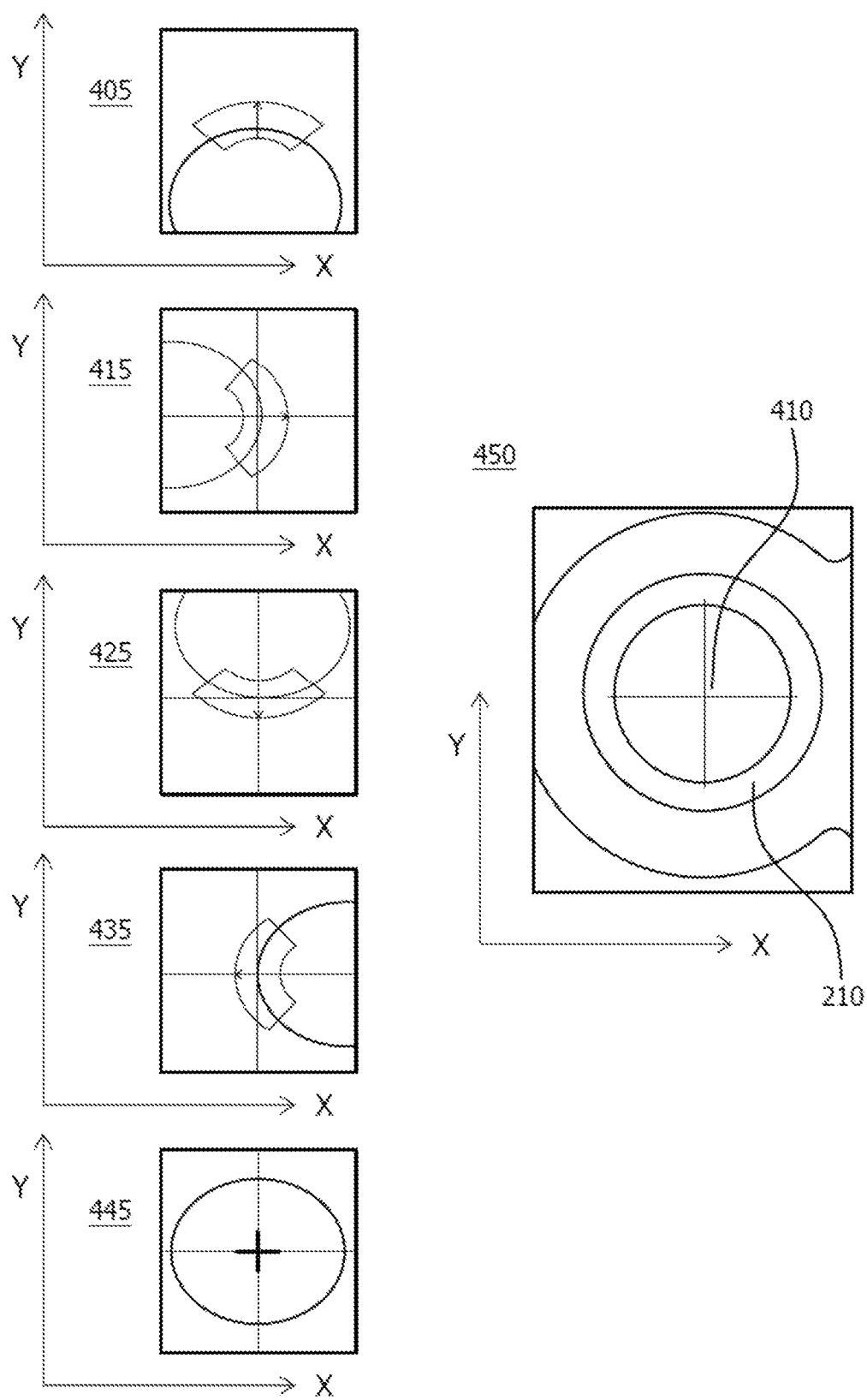
FIG. 4 depicts a plurality of images that may be used to determine the center of a through hole.

FIG. 4 shows a plurality of images 405, 415, 425, 435 and 445 of the through hole. The plurality of images 405, 415, 425, 435 and 445 are used to determine the center 410 of the through hole 210. Although five images are shown, any number of images may be used to determine the center of the through hole 210. These images may be acquired for any number of the through holes 210A-210D on the printed circuit board 200.

Figure 5:
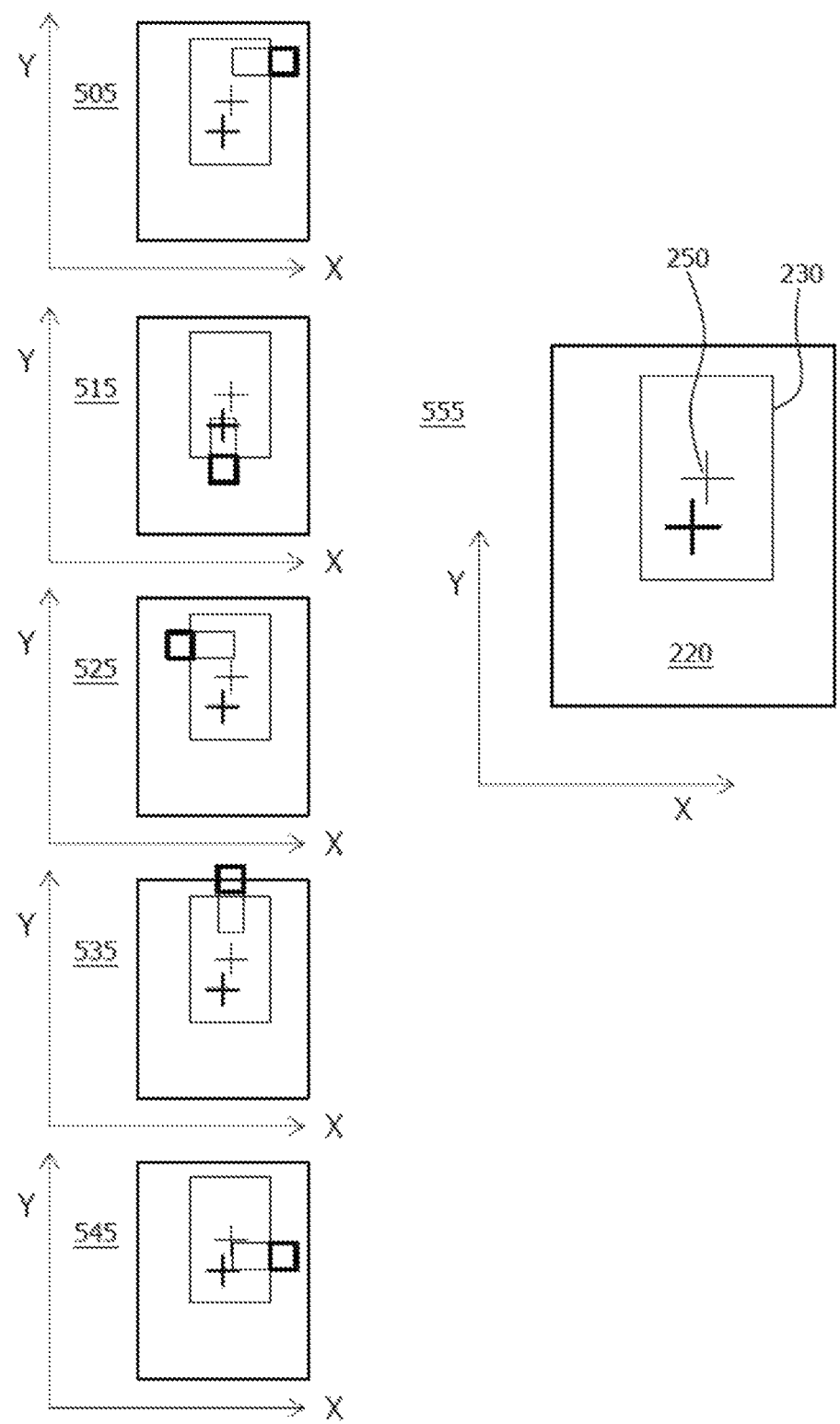
FIG. 5 depicts a plurality of images that may be used to determine the center of an LED emitter.

FIG. 5 shows a plurality of images 505, 515, 525, 535 and 545 of the LED module. The plurality of images 505, 515, 525, 535 and 545 are used to determine the center 250 of the LED emitter 230. In many embodiments, the center of the 240 LED module and the center 250 of LED emitter are not the same. Although five images are shown, any number of images may be used to determine the center of the LED module 220.

Figure 6:
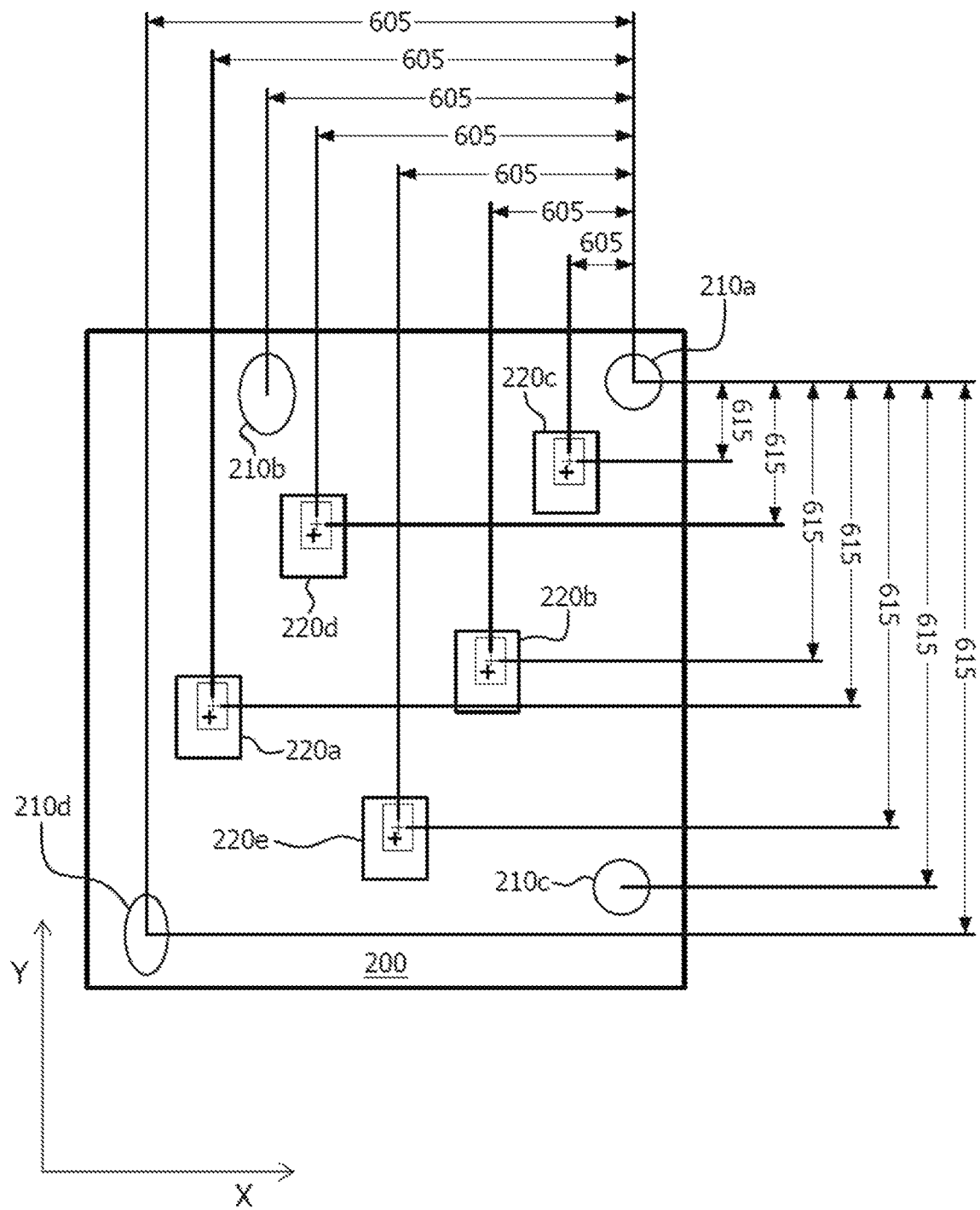
FIG. 6 depicts example measurements using a first through hole as a first fiducial.

An illustration of through holes 210*a* and 210*c* used as fiducials is depicted in FIG. 6. The placement of the LED modules 220 in step 340 requires accurate measurements. Embodiments are able to obtain accurate measurements by using the center 410 of the through holes 210 as fiducial. For example, measurements known distance 605 are determined with respect to the center 410*a* of through hole 210*a* in the Ydirection. Similarly, measurements 615 are determined with respect to the center 410*a* of through holes 210*a* in the X direction. By using the center 410 of the through holes 210 as fiducial for the measurements, this is method used for measuring the LED placement accuracy.

Figure 7:
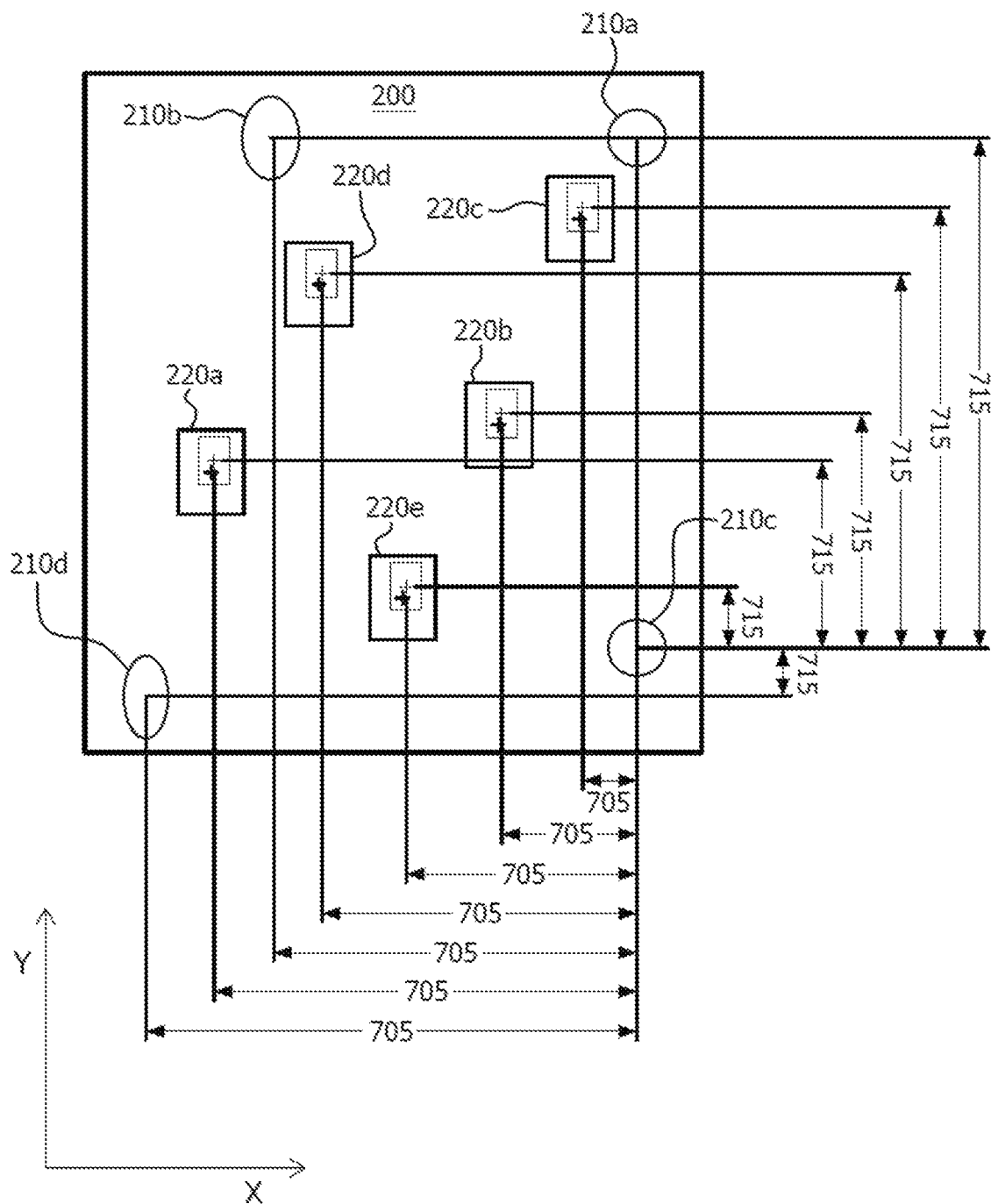
FIG. 7 depicts example measurements using a second through hole as a second fiducial.

FIG. 7 shows another example of through holes 210*a* and 210*c* used as fiducials. Measurements 705 are made to place the LED modules 220 with respect to the center 410*c* of through holes 210*c* in the Ydirection. Additional measurements 715 are made with respect to the center 410*c* of through hole 210*c* in the X direction.

The methods provided, to the extent applicable, may be implemented by Surface-Mount Technology (SMT) machines. The SMT machines may execute a program that includes instructions for the machine to execute the provided methods.

The methods or flow charts provided herein, to the extent applicable, may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

It is to be understood that the present invention is not limited to the embodiments described above, but encompasses any and all embodiments within the scope of the following claims. Additionally, although the features and elements of the present application are described in the example embodiments in particular combinations, each feature or element can be used alone (without the other features and elements of the example embodiments) or in various combinations with or without other features and elements of the present application.

What is claimed is:

1. A method of forming a Light Emitting Diode (LED) assembly, the method comprising:
   drilling a first through hole in a printed circuit board, wherein the first through hole attaches the printed circuit board to a housing;
   determining a first fiducial based on the first through hole on the printed circuit board,
      wherein the first fiducial is used to determine a LED module placement accuracy within the printed circuit board;
   after determining the first fiducial, determining, using a plurality of images of a LED module, a center of a LED emitter of the LED module, wherein the LED is integral to the LED module and the center of the LED emitter is different than a center of the LED module;
   placing the LED module on the printed circuit board based on the first fiducial and the center of the LED emitter of the LED module.

2. The method of claim 1, further comprising:
   drilling a second through hole in the printed circuit board, wherein the second through hole attaches the printed circuit board to the housing;
   determining a second fiducial based on the second through hole; and
   placing the LED module on the printed circuit board based on the first fiducial, the second fiducial and the center of a LED emitter.

3. The method of claim 1, further comprising:
   applying a solder paste to the printed circuit board in a region of the printed circuit board where the LED module is placed; and
   reflowing the solder paste to permanently connect the LED module to the printed circuit board.

4. The method of claim 1, further comprising:
   applying an electrically conductive adhesive material to the printed circuit board in a region of the printed circuit board where the LED module is placed.

5. The method of claim 3, further comprising:
   applying non-conductive adhesive to the printed circuit board in the region of the printed circuit board where the LED module is placed.

6. The method of claim 5, further comprising:
   after applying the non-conductive adhesive, reflowing the solder paste to permanently connect the LED module to the printed circuit board.

7. The method of claim 1, wherein:
   the determining the center of the LED emitter of the LED module is based on a plurality of digital images.

8. The method of claim 2, wherein:
   the first fiducial is determined based on a center of the first drilled through hole; and
   the second fiducial is determined based on a center of the second drilled through hole.

9. The method of claim 1, further comprising:
   determining centers for LED emitters of each of a plurality of LED modules;
   and placing the plurality of LED modules on the printed circuit board based on the centers and the first fiducial.

10. The method of claim 9, further comprising:
    drilling a second through hole in the printed circuit board, wherein the second through hole attaches the printed circuit board to the housing;
    determining a second fiducial based on the second through hole; and
    placing the plurality of LED modules on the printed circuit board based on the first fiducial, the second fiducial and the centers.

11. A non-transitory computer readable storage media that stores instructions, wherein the instruction control a computer control circuit board manufacturing device, the instructions comprising:
    a drilling instruction that causes the computer control circuit board manufacturing device to drill a first through hole in a printed circuit board, wherein the first through hole attaches the printed circuit board to a housing;
    a first determining instruction that causes the computer control circuit board manufacturing device to determine a first fiducial based on the first through hole on the printed circuit board, wherein the first fiducial is used to determine a LED module placement accuracy within the printed circuit board;
    a second determining instruction that causes the computer control circuit board manufacturing device to determine, after the first fiducial is determined, a center of a LED emitter of a LED module by using a plurality of images of the LED module, wherein the LED is integral to the LED module and the center of a LED emitter is different than a center of the LED module;
    a placing instruction that causes the computer control circuit board manufacturing device to place the LED module on the printed circuit board based on the first fiducial and the center of the LED emitter of the LED module.

12. The non-transitory computer readable storage media of claim 11, further comprising:
    a second drilling instruction that causes the computer control circuit board manufacturing device to drill a second through hole in the printed circuit board, wherein the second through hole attaches the printed circuit board to the housing;
    a third determining instruction that causes the computer control circuit board manufacturing device to determine a second fiducial based on the second through hole; and
    wherein the placing instruction causes the computer control circuit board manufacturing device to place the LED module on the printed circuit board based on the first fiducial, the second fiducial and the center of a LED emitter.

13. The non-transitory computer readable storage media of claim 11, further comprising:
    a solder paste applying instruction that causes the computer control circuit board manufacturing device to apply a solder paste to the printed circuit board in a region of the printed circuit board where the LED module is placed; and a reflowing instruction that causes the computer control circuit board manufacturing device to reflow the solder paste to permanently connect the LED module to the printed circuit board.

14. The non-transitory computer readable storage media of claim 11, further comprising:

an applying instruction that causes the computer control circuit board manufacturing device to apply an electrically conductive adhesive material to the printed circuit board in a region of the printed circuit board 10 where the LED module is placed.

15. The non-transitory computer readable storage media of claim 13, further comprising:

a non-conductive adhesive applying instruction that causes the computer control circuit board manufacturing device to apply non-conductive adhesive to the printed circuit board in the region of the printed circuit board where the LED module is placed.

16. The non-transitory computer readable storage media of claim of claim 15, further comprising:

a reflowing instruction that is executed after the non-conductive adhesive applying instruction, wherein the reflowing instruction causes the 5 solder paste to permanently connect the LED module to the printed circuit board.

17. The non-transitory computer readable storage media of claim 11, wherein:

the determining the center of the LED emitter of the LED module is based on a plurality of digital images.

18. The non-transitory computer readable storage media of claim 12, wherein:

the first fiducial is determined based on a center of the first drilled through hole; and the second fiducial is determined based on a center of the second drilled through hole.

19. The non-transitory computer readable storage media of claim 11, wherein:

the second determining instruction further causes the computer control circuit board manufacturing device to determine centers for LED emitters of each of a plurality of LED modules; and the placing instruction further causes the computer control circuit board manufacturing device to place the plurality of LED modules on the printed circuit board based on the centers and the first fiducial and second fiducial.

20. The non-transitory computer readable storage media of claim 19, further comprising:

drilling a second through hole in the printed circuit board, wherein the second through hole attaches the printed circuit board to the housing;

determining a second fiducial based on the second through hole; and placing the plurality of LED modules on the printed circuit board based on the first fiducial, the second fiducial and the centers.

* * * * *